(12) United States Patent
Naffziger

(10) Patent No.: US 6,326,829 B1
(45) Date of Patent: Dec. 4, 2001

(54) PULSE LATCH WITH EXPLICIT, LOGIC-ENABLED ONE-SHOT

(75) Inventor: Samuel D Naffziger, Ft Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/417,584

(22) Filed: Oct. 14, 1999

(51) Int. Cl.[7] .............................. H03K 3/10; H03K 3/033; H03K 3/284; H03K 3/355
(52) U.S. Cl. .......................... 327/227; 327/199; 327/175; 327/292; 327/212; 375/354
(58) Field of Search .................................... 327/199, 202, 327/203, 211, 212, 215, 227, 175, 291, 292, 299; 326/119, 121, 95, 98; 365/154; 375/354

(56) References Cited

U.S. PATENT DOCUMENTS

| | | | |
|---|---|---|---|
| 4,495,628 | * | 1/1985 | Zasio ..................................... 327/202 |
| 5,023,486 | * | 6/1991 | Gongwer ............................... 365/154 |
| 5,359,232 | * | 10/1994 | Eitrheim et al. ...................... 327/175 |
| 5,369,672 | * | 11/1994 | Matsumoto ........................... 375/106 |
| 5,387,825 | * | 2/1995 | Cantrell et al. ....................... 326/26 |
| 5,467,038 | * | 11/1995 | Motley et al. ........................ 327/202 |
| 5,491,444 | * | 2/1996 | McClure ............................... 327/203 |
| 5,548,622 | * | 8/1996 | Ma ......................................... 375/354 |
| 5,552,738 | * | 9/1996 | Ko ......................................... 327/203 |
| 5,557,225 | * | 9/1996 | Denham et al. ...................... 327/199 |
| 5,612,632 | * | 3/1997 | Mahant-Shetti et al. ............. 327/203 |
| 5,671,258 | * | 9/1997 | Burns et al. .......................... 327/291 |
| 5,748,616 | * | 5/1998 | Riley ..................................... 327/141 |
| 5,831,463 | * | 11/1998 | Sachdev ............................... 327/202 |
| 6,005,819 | * | 12/1999 | Shin ...................................... 365/226 |
| 6,087,872 | * | 7/2000 | Partovi et al. ........................ 327/201 |
| 6,133,861 | * | 10/2000 | Jusuf et al. ........................... 327/157 |
| 6,229,360 | * | 5/2001 | Mizuno et al. ....................... 327/199 |

OTHER PUBLICATIONS

Hamid Partovi, et al., "Flow-Through Latch and Edge-Triggered Flip-flop Hybrid Elements," ISSCC96/Feb. 9, 1996/Sea Cliff/Digest of Technical Papers.

Weste et al., "Principles of CMOS VLSI Design," Addison-Wesley Publishing Co. (1985), pp. 9–12.

* cited by examiner

Primary Examiner—Terry D. Cunningham
Assistant Examiner—Long Nguyen

(57) ABSTRACT

CMOS integrated circuitry responsive to a clock source having an approximately 50% duty cycle includes a one shot having an input terminal connected to be responsive to the clock wave source. The one shot derives a pulse train in response to cycles of the clock. Each pulse in the pulse train has a duration substantially less than one-half cycle of the clock wave, is initiated in response to and during a clock wave transition, and persists for a period after the transition has been completed. Latches respond to plural data signals and the pulse train so each latch is activated to be responsive to its associated data signal only during the pulses.

32 Claims, 4 Drawing Sheets

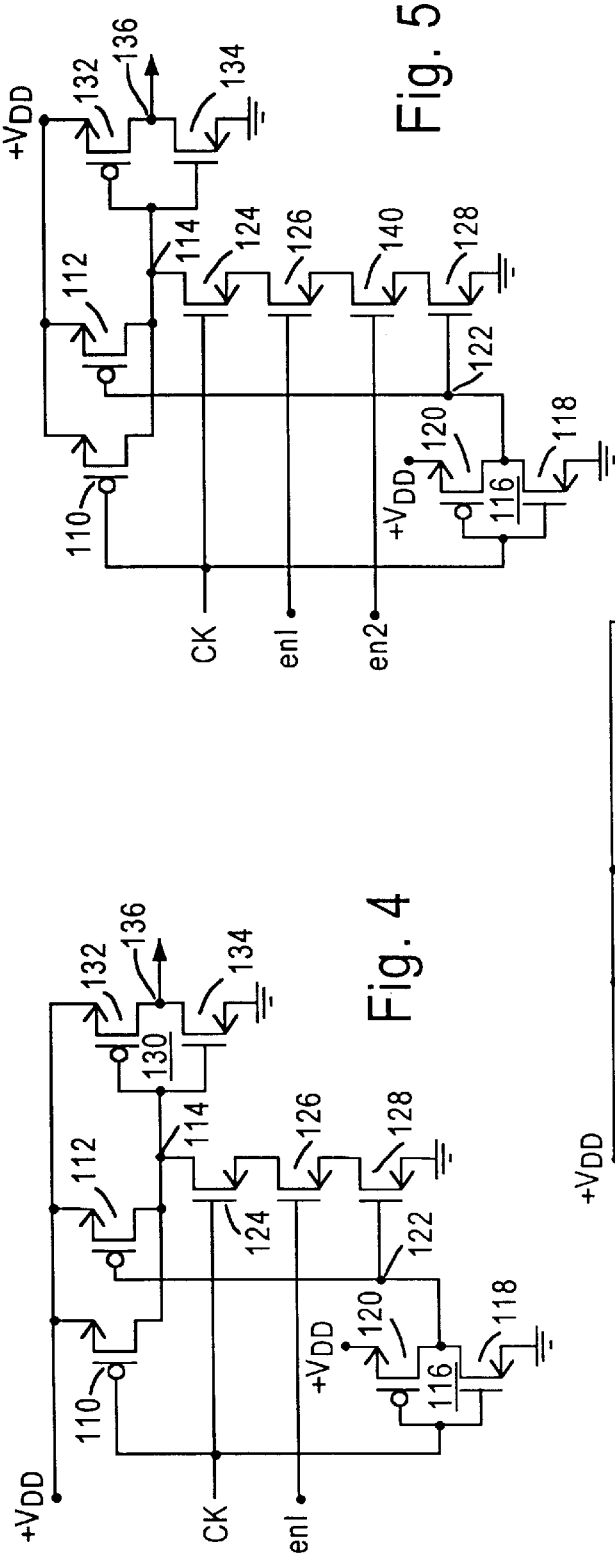
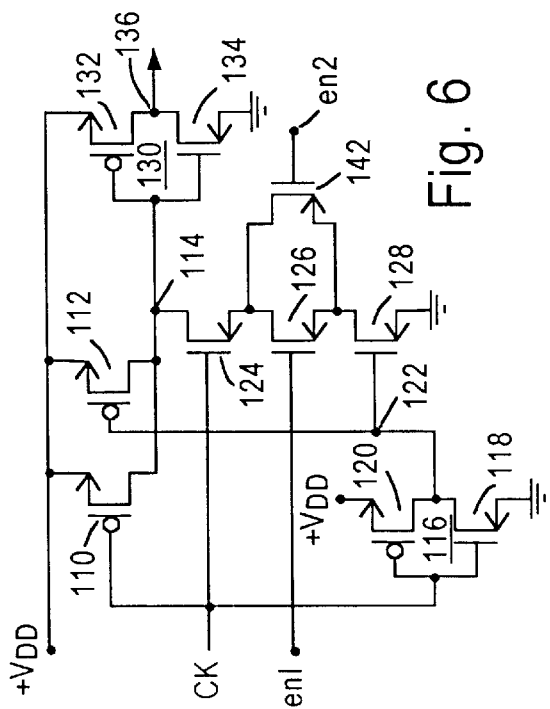
Fig. 4
Fig. 5
Fig. 6

PULSE LATCH WITH EXPLICIT, LOGIC-ENABLED ONE-SHOT

FIELD OF INVENTION

The present invention relates generally to integrated circuit clock circuitry and more particularly to clock circuitry including at least one and usually many latches driven in parallel by a one shot that derives a pulse train in response to clock waves having about a 50% duty cycle, wherein each pulse in the pulse train (1) is initiated in response to a clock wave transition, and (2) persists after the transition has been completed for less than a half cycle of each clock cycle.

BACKGROUND ART

Most integrated circuits include one of two different types of clock arrangements. These clock arrangements are responsive to clock waves generally derived from sources external to the integrated circuit chip. The clock waves typically have about a 50% duty cycle, such that during half of each cycle of the clock wave, the clock wave has a high value and during the other 50% of each cycle, the clock wave has a low amplitude.

In one type of prior art integrated circuit clock circuitry, the circuits respond to an edge of the clock wave during each cycle. Latches and other circuit elements are activated in response to a leading or trailing edge of a clock.

A problem with the edge responsive integrated circuit, when it is used in relatively large integrated circuit chips (e.g., chips having sides 2 centimeters long) and operating at relatively high frequencies (e.g., 1 GHz), is that the clock edges arrive at the various circuits on the chips at different times. This phenomenon, generally known as clock skew, results in poor synchronization of circuits on different portions of the integrated circuit chip. The poor synchronization can result in an improper transfer of data signals between the circuits on the chip. The problem is compounded because the propagation delay of the clock wave to different portions of the chip is variable, as a function of (1) processing variations of different circuit elements on different portions of the chip, (2) temperature and (3) power supply voltage. The temperature and power supply voltages vary as a function of time and spatial location of circuits on the chip.

"Flow-through-Latch and Edge-Triggered Flip-Flop Hybrid Elements," Partovi, et al., ISSCC 96 Paper FA 8.5, 1996, discloses a prior art clock responsive latch that compensates for clock skew. The Partovi et al. latch incorporates an implicit pulse generator for extending the time during which the latch can be responsive to a data signal subsequent to an edge of a clock. The implicit pulse generator in each latch requires substantial additional circuit elements in an integrated circuit having tens of thousands of latches. The additional circuit elements in all of the latches on the chip occupy a substantial amount of space on the chip. In addition, the additional circuit elements in each latch absorb a substantial amount of power from a clock source, thereby requiring additional clock amplifiers on the chip.

The other generally employed integrated circuit clock scheme is referred to as two-phase transparent. In the two-phase transparent approach, two latches are required for each cycle of the clock wave. For a typical two-phase transparent latch clock system, between 16% and 24% of the period of a clock cycle having a frequency of 1 GHz is required for a data signal to flow through a pair of latches. Hence, the amount of time remaining for processing during the clock cycle is a relatively small percentage of each clock cycle. Thereby, an advantage of the increased data processing speed that should be associated with increased clock frequency, i.e., increased data processing speed, is not achieved. Another major disadvantage of the two-phase transparent clock arrangement is that the two latches which are required for each clock cycle increase the amount of space the latches occupy on the chip. These latch space requirements reduce the number of functions which can actually be performed by logic circuits on a particular integrated circuit chip.

It is, accordingly, an object of the present invention to provide a new and improved integrated circuit clock arrangement.

Another object of the invention is to provide a new and improved integrated circuit clock arrangement that employs only one latch per clock cycle to thereby increase the number of functions which can be performed on an integrated circuit chip relative to the prior art two-phase transparent arrangement.

An added object of the invention is to provide a new and improved integrated circuit clock arrangement having improved synchronization properties because it has a relaxed sensitivity to clock edge placement with respect to data.

An additional object of the present invention is to provide a new and improved integrated circuit chip having clock circuitry enabling the chip to operate at a relatively high frequency on a relatively large integrated circuit chip.

A further object of the invention is to provide new and improved integrated clock circuitry wherein the clock circuitry and the circuits associated therewith occupy a relatively small amount of space on the chip and the time required for data to flow through a latch is substantially less than that of a two-phase transparent arrangement.

Still another object of the invention is to provide a new and improved integrated circuit latch that achieves the clock skew advantages achieved by prior art latches incorporating an implicit pulse generator.

A further object of the invention is to provide new and improved clock circuitry that includes a logic arrangement for enabling derivation of a clock wave in response to at least one logic signal having a predetermined relation.

SUMMARY OF THE INVENTION

In accordance with one aspect of the invention, an integrated circuit adapted to be responsive to a clock wave source and a data signal comprises a one shot having an input terminal connected to be responsive to the clock wave source. The one shot is arranged for deriving pulses in response to cycles of the clock. Each of the pulses has a finite duration, substantially less than one half of a cycle of the clock wave, but sufficiently long to overcome clock skew; in one preferred embodiment the pulse duration is about 100 picoseconds (ps), i.e., about 10% of a one GHz clock cycle. Such an arrangement allows circuitry, such as a latch, to pass the data signal to a regenerative feedback circuit.

To reduce the clock circuitry space requirements on the chip, a plurality of the latches or other circuits responsive to the clock are connected in parallel to be responsive to the pulses derived by the one shot.

Because the one shot produces a pulse that is substantially longer than the duration of an edge, the circuitry driven by the one shot can respond to data signals from different parts of the integrated circuit without the synchronization problems associated with the edge responsive clock circuitry.

Because only one latch per clock wave cycle is required, volume on the chip devoted to the latch circuitry is substantially reduced relative to the two-phase transparent latch clock circuitry. In addition, the use of a one shot responsive to each cycle of the clock wave enables the flow through time of the latch circuit required to perform logic steps (i.e., overhead) to be no more than about 10%.

In certain instances, plural latch circuits are connected in cascade and located in close proximity on the integrated circuit chip. The plural latch circuits have pass through gates driven in parallel by clock pulses from the same one shot. In such an instance, there is a tendency for a data signal to flow through both of the latches during the same clock cycle. The latches, in combination with delay characteristics of combinational logic gates cascaded with the latches, overcome this tendency.

Another feature of the invention is that the one shot can be activated by combining the clock wave with bi-level signals in accordance with desired logic functions. The clock wave and the logic signals are combined in logic circuitry, which operates in accordance with the desired logic functions. For example, the one shot produces clock pulses only in response to the logic functions being satisfied simultaneously with the clock wave having a predetermined transition direction and amplitude associated with one particular half cycle of the clock wave.

The above and still further objects, features and advantages of the present invention will become apparent upon consideration of the following detailed descriptions of several specific embodiments thereof, especially when taken in conjunction with the accompanying drawings.

BRIEF DESCRIPTION OF DRAWINGS

FIG. 4 is a circuit diagram of a preferred embodiment of a one shot that can be employed in the apparatus of FIG. 1;

FIG. 5 is a circuit diagram of a further embodiment of a one shot, employing AND logic, that can be employed in the apparatus of FIG. 1;

FIG. 6 is a circuit diagram of another embodiment of a one shot, employing OR logic, that can be used as the one shot of FIG. 1.

DETAILED DESCRIPTION OF THE DRAWINGS

Figure 1:
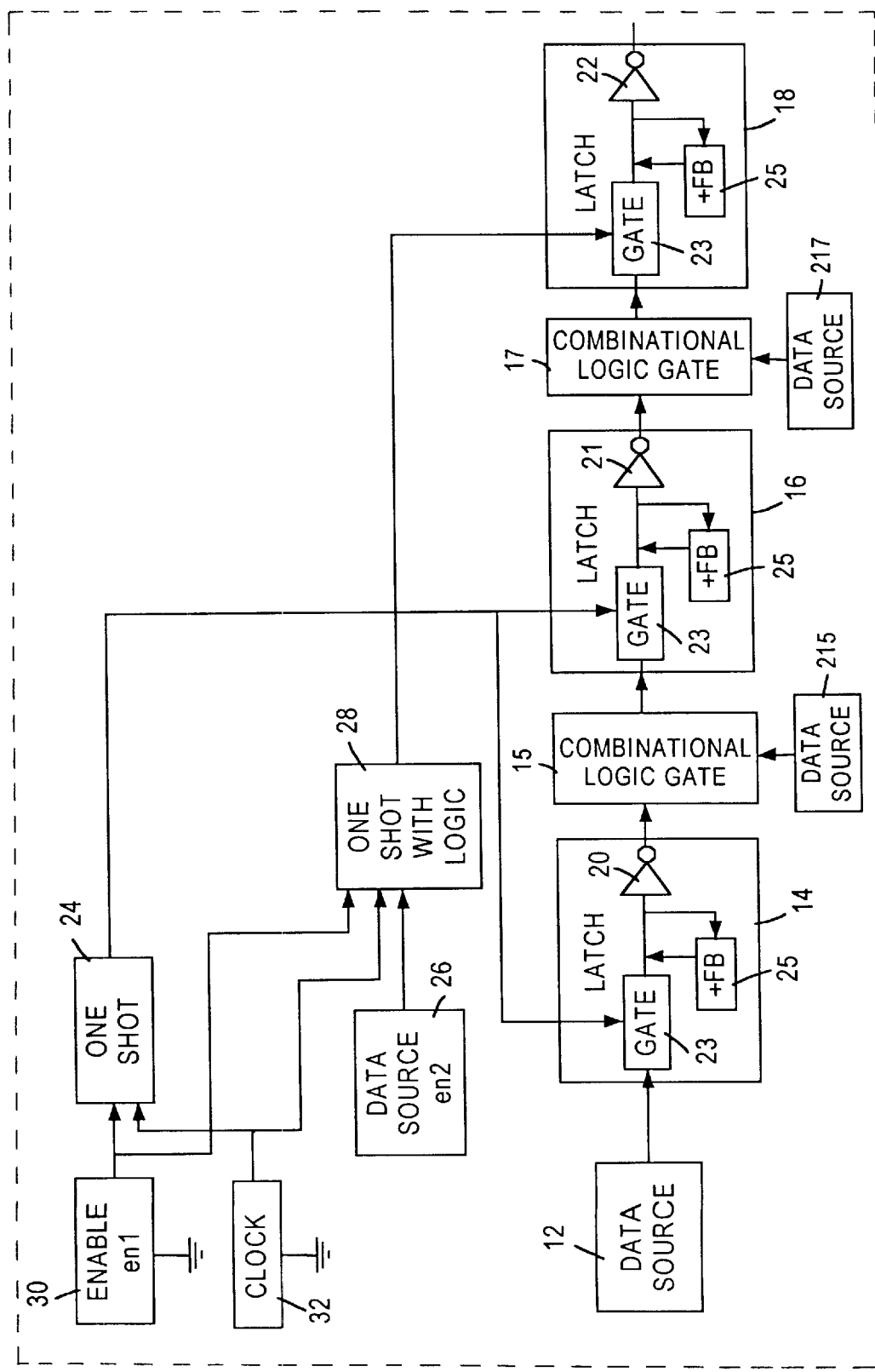
FIG. 1 is a block diagram of clock circuitry on an integrated circuit chip in accordance with a preferred embodiment of the present invention.

Reference is now made to FIG. 1 of the drawing wherein integrated circuit chip 10, including complementary metal oxide semiconductor (CMOS) transistors, is illustrated as including binary data source 12, and cascaded latches 14, 16 and 18. Combinational logic gates 15 and 17, respectively responsive to binary data sources 215 and 217 and signal latches 14 and 16 respectively drive signal input terminals of latches 16 and 18. Combinational logic gates 15 and 17 are of the type generally discussed on pages 9–12 of Weste et al., *Principles of CMOS VLSI Design*, Addison-Wesley Publishing Co., (1985). Gate 15 logically combines the plural input signals thereof from latch 14 and source 217 to supply a logic signal to latch 16. Gate 15, which can respond to more than two input signals, introduces sufficient delay between the output of latch 14 and the input to latch 16 to overcome a tendency for a signal from source 14 to race through latches 14 and 16 during a single period of clock source 32. Similarly, gate 17 logically combines the plural input signals thereof to supply a logic signal to latch 18. The delay characteristics of gates 15 and 17 are similar, and are such as to delay the leading edges of the inputs thereof from latches 14 and 16 by at least ten percent of a period of clock source 32; the delay of each of gates 15 and 17 is less than one cycle time of clock source 32.

Integrated circuit chip 10 also includes one shot 24, binary data source 26, and one shot 28, which contains logic circuitry. One shots 24 and 28 are both respectively responsive to enable source 30 (en1) and clock source 32; sources 30 and 32 respectively supply an enable signal and a clock wave train to circuits on chip 10. One shot 28 is also responsive to data source 26 (en2).

In one preferred embodiment, chip 10 has two centimeter sides, a +1.3 volt DC power supply terminal or rail, a ground power supply or rail, and clock source 32 has a frequency of one gigahertz (GHz). It is to be understood that a typical integrated circuit chip includes thousands of circuit components and that the components illustrated in FIG. 1 are for exemplary purposes only. Further, the frequency of clock source 32 can be any suitable value.

Each of latches 14, 16 and 18 respectively includes an internal inverter 20, 21, 22, for driving the latch output terminal. Each of latches 14, 16 and 18 also includes a pass through gate 23 and a positive feedback circuit 25.

Clock 32 derives a trapezoidal clock (CK) wave 34 (FIG. 7) having slightly more than a 50% duty cycle. Each cycle of clock wave 34 includes a low voltage (i.e., ground) portion 36, followed by positive going ramp 38, followed by high voltage (i.e., approximately equal to the positive DC power supply voltage of chip 10) portion 50, followed by negative going ramp 52. In a preferred embodiment, each of ramps (i.e., transitions) 38 and 52 has a duration of about 14% of one clock cycle (i.e., about 140 picosecond (ps) for a 1 GHz clock); low voltage portion 36 has a duration of about 28% of one clock cycle, and high voltage portion 50 has a duration of about 44% of one clock cycle. Field effect transistors of chip 10 driven only by clock wave 34 turn on and off when source gate voltages thereof are approximately halfway between high and low voltage portions 36 and 50, i.e., about halfway up each of ramps 38 and 52 so these transistors have about a 58% duty cycle.

Clock 32 drives one shots 24 and 28 in parallel. When enable source 30 derives a high voltage logic value, typically equal to about the positive power supply voltage of chip 10, one shot 24 responds to waveform 34 to derive pulse type clock wavetrain 42 (PCK), FIG. 7. Each cycle of PCK wavetrain 42 includes relatively long duration low voltage (i.e., ground) portion 48 followed by positive going ramp 40, followed by short duration high voltage (i.e., at about the chip power supply) portion 44, in turn followed by negative going ramp 46. Each cycle of PCK wavetrain 42 has the same period equal to one cycle of CK wavetrain 34, but low voltage portion 48 has a duration of about 80% of each CK cycle, each of ramps 40 and 46 has a duration of about 6.1% of each CK cycle, and high voltage portion 44 has a duration of about 7.8% of each CK cycle.

Ramps 38 and 40 of the CK and PCK clocks start substantially simultaneously but ramp 40 is steeper than ramp 38 and reaches its maximum value about 60 ps after starting. Typically the field effect transistors of chip 10 responsive only to PCK pulse clock waveform 42 turn off when PCK transition 46 reaches a voltage about 40% of the difference between the voltage levels of low and high portions 48 and 44, and therefore have a turn on duration of about 11% of one CK clock cycle, as indicated by transparency window 54, FIG. 7.

One shot 28 produces the same output waveform 42 as one shot 24 when the logic function incorporated in one shot 28 is satisfied by data source 26, enable source 30 and clock 32. The logic function can be any of the well known Boolean functions, such as AND, OR, NAND, NOR and EXCLUSIVE OR. The circuits for the AND and OR functions are respectively described in connection with FIGS. 5 and 6.

Latches 14 and 16 respond to PCK waveform 42, as derived from one shot 24, while latch 18 responds to a similar PCK waveform, as derived from one shot 28. Latches 14, 16 and 18 respectively respond to the binary data signals source 12, gate 15 and gate 17 supply to the input circuits thereof, only during the intervals indicated in FIG. 7 by transparency windows 54; i.e., latches 14, 16 and 18 are respectively responsive to the signals from source 12, gate 15 and gate 17 only during transparency windows 54. Transparency windows 54 are open to permit latches 14, 16 and 18 to be responsive to the input signals thereof for a period beginning approximately at the time waveform 42 makes a transition from positive going ramp 40 to high voltage waveform portion 44. Transparency windows 54 continue until the trailing edge 46 of waveform 42 has dropped somewhat below a voltage level approximately halfway between the voltage levels of waveform portions 44 and 48, i.e., prior to the transition of negative going ramp 46 reaching low voltage waveform portion 48. Hence, window 54 is open for about twenty percent of a half cycle of CK clock wave 34 and opens initially slightly before the completion of each leading edge positive going transition of CK.

Latches 14, 16 and 18 respectively respond to the binary data signals source 12, gate 15 and gate 17 derive during the approximately 100 ps period while transparency windows 54 are open, so binary data output voltages of these latches change relatively quickly. Each of latches 14, 16 and 18 includes regenerative feedback circuit 25 for maintaining the output voltages of the latches relatively constant until the next transparency window 54 is open, at which time the output voltages of the latches are subject to change.

Figure 2:
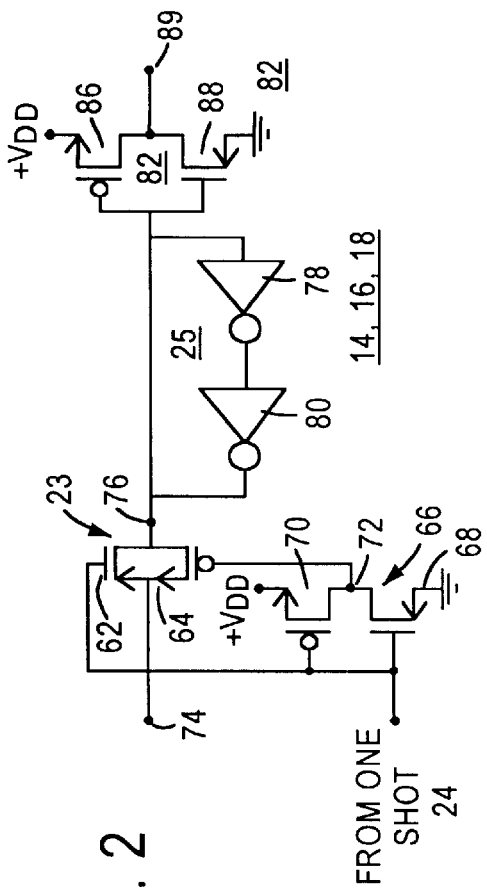
FIG. 2 is a circuit diagram of one embodiment of a latch circuit preferably employed in the clock circuitry illustrated in FIG. 1.

FIG. 2 is a circuit diagram of one preferred embodiment of each of latches 14, 16 and 18. The circuit illustrated in FIG. 2 comprises pass through gate 23 including complementary field effect transistors 62 and 64 such that the gate of N-channel field effect transistor (FET) 62 is directly responsive to the pulses of the PCK clock wave derived by one shot 24, while the gate of P-channel field effect transistor 64 is responsive to an inverted replica of the PCK wave one shot 24 derives. Inverter 66 derives the inverted replica of the PCK clock wave applied to the gate of field effect transistor 64. Inverter 66 includes complementary field effect transistors 68 and 70, having gates driven in parallel by the PCK output of one shot 24. Transistors 68 and 70 have source drain paths connected in series with each other, between ground and the $+V_{DD}$ (preferably 1.3 volt) DC power supply voltage of chip 10. The drains of field effect transistors 68 and 70 have a common terminal 72 that supplies the inverted PCK replica directly to the gate of field effect transistor 64.

Transistors 62 and 64 of pass through gate 23 have parallel source drain paths connected in series between the latch input data terminal 74 and storage node or terminal 76, such that the sources of transistors 62 and 64 are common to terminal 74, while the drains of transistors 62 and 64 are common to terminal 76. Pass through gate 60 passes high and low levels of the bi-level data signal at terminal 74 at the time one shot 24 derives the positive voltage level associated with transparency window 54 (FIG. 7) being open. Terminal 74 of latch 14 is connected to the output of data source 12 while the terminals 74 of latches 16 and 18 are respectively connected to the outputs of latches 14 and 16.

Regenerative feedback circuit 25 including cascaded inverters 78 and 80 responds to the binary level at terminal 76. Inverter 78 has an input terminal connected directly to terminal 76 and an output terminal connected to an input terminal of inverter 80. Inverter 80 has an output terminal connected back to terminal 76. The arrangement of inverter 78 and 80 with terminal 76 maintains the voltage at terminal 76 constant, except when transparency window 54 is open, i.e., during the interval during which pass through gate 23 is open to pass the signal at terminal 74. When transparency window 54 is closed the source drain paths of transistors 62 and 64 are off to isolate terminal 76 from signals at terminal 74, i.e., from signals upstream of the latch.

Inverter 82, including complementary field effect transistors 84 and 86, amplifies and inverts the binary level at terminal 76. (Inverter 82 in FIG. 2 is the same as inverters 20, 21 and 22 in latches 14, 16 and 18 of FIG. 1.) Transistors 84 and 86 have (1) source drain paths series connected between the DC power supply voltage rails of chip 10 and (2) gate electrodes connected in parallel to be driven by the voltage level at terminal 76. The drains of transistors 84 and 86 have a common terminal 89 to define the latch output terminal.

Figure 3:
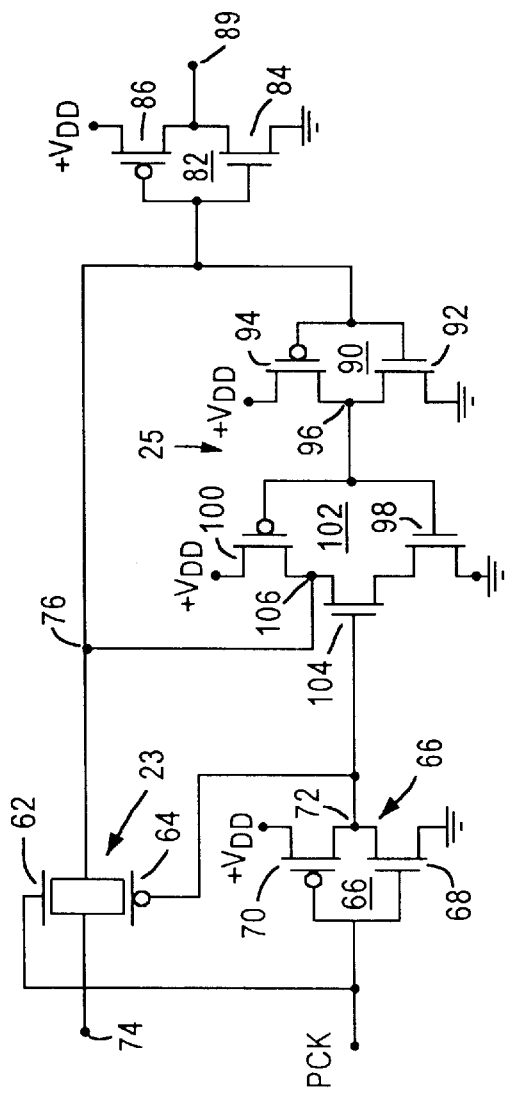
FIG. 3 is a circuit diagram of another latch circuit preferably employed in the clock circuitry of FIG. 1.

FIG. 3 is a circuit diagram of another embodiment of any of latch circuits 14, 16 and 18. The latch circuit in FIG. 3 is, to a large extent, the same as the latch circuit of FIG. 2, except that the latch circuit of FIG. 3 employs a regenerative feedback circuit including inverters 90 and 102, instead of inverters 78 and 80. Inverter 90 is essentially the same as inverter 78 but inverter 102 responds to outputs of inverters 66 and 90.

Inverter 90 includes the series connected source drain paths of complementary field effect transistors 92 and 94 having gate electrodes driven in parallel by the voltage at terminal 76. Source drain paths of transistors 92 and 94 are connected in series between the positive and ground DC power supply terminals of chip 10, such that the drains of complementary N-channel field effect transistor 92 and P-channel field effect transistor 94 are connected to common terminal 96.

The voltage at terminal 96 drives in parallel the gates of complementary field effect transistors 98 and 100 of inverter 102. The source drain paths of transistors 98 and 100 are connected in series with the source drain path of N-channel field effect transistor 104, having a gate connected to output terminal 72 of inverter 66. The series connected source drain paths of field effect transistors 98, 100 and 104 are connected between the power supply terminals of chip 10. Inverter 102 includes output terminal 106, common to the drains of P-channel field effect transistor 101 and N-channel field effect transistor 104.

Figure 7:
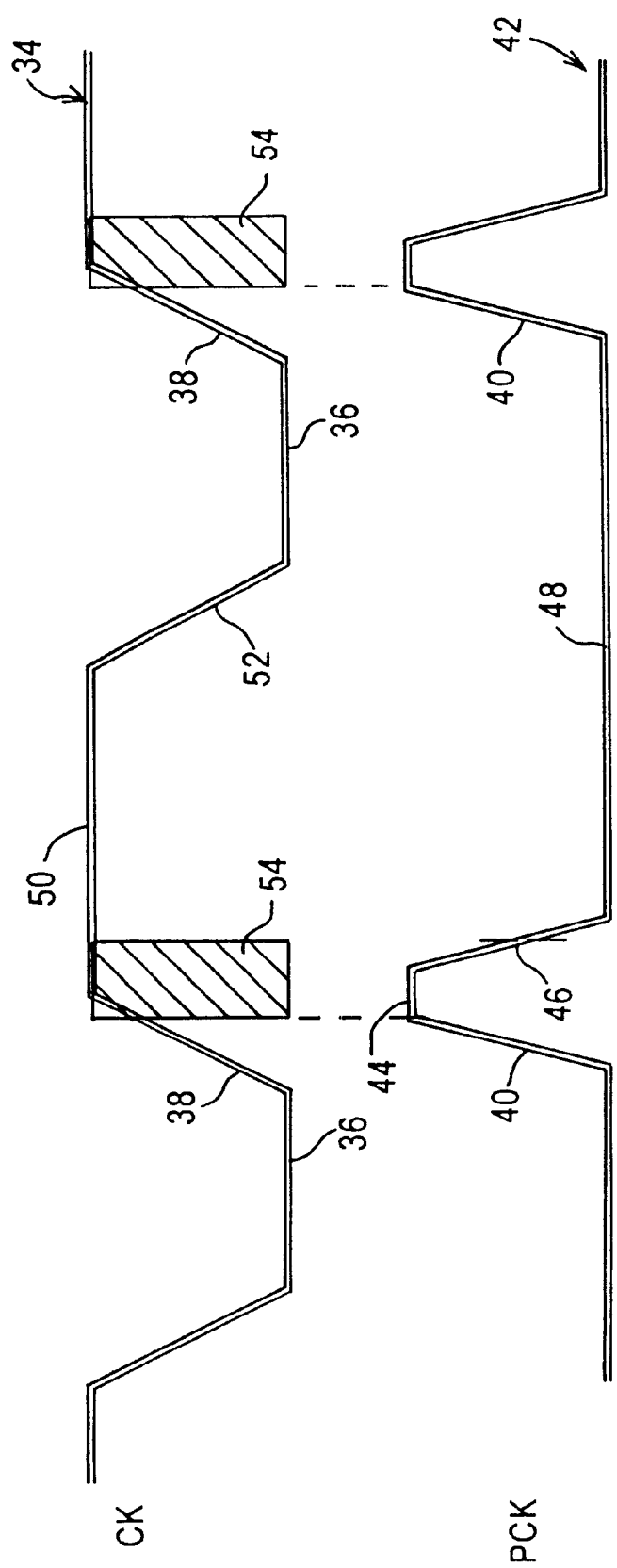
FIG. 7 includes waveforms helpful in describing the operation of each of FIGS. 1–6.

In operation, inverter 102 is disabled while the latch of FIG. 3 is transparent, i.e. while transparency window 54, FIG. 7, is open. While transparency window 54 is open, the high PCK signal causes the voltage at terminal 72 to be low to turn off (i.e., cut off) the source drain path of field effect transistor 104. Because the source drain path of transistor 104 is cut off while transparency window 54 is open, the voltage at terminal 76 can follow the voltage applied to pass through gate 23 input terminal 74. If, for example, the voltage at terminal 74 is high while (1) pass through gate 23 is open, and (2) transparency window 54 is open to cut off the source drain of transistor 104, inverter 90 changes the resulting high voltage at terminal 76 to a low voltage that the inverter applies to terminal 96. The low voltage at terminal 96 back biases the gate of transistor 98 and forward biases the gate of transistor 100 to turn on the source drain path of field effect transistor 100 which applies the positive power supply voltage $+V_{DD}$ at the source of transistor 100 to terminal 106 to drive terminal 76 to a high voltage. If, however, the data signal at terminal 74 is low during transparency window 54, the low voltage is coupled through the source drain path of transistor 62 of pass through gate 23 to terminal 76. Inverter 90 responds to the low voltage at terminal 76 to apply a high voltage to terminal 96. The high voltage at terminal 96 turns on the source drain path of transistor 98 and cuts off the source drain of transistor 100, so that terminal 106 remains at the low voltage at terminal 76.

While transparency window 54 is closed, the output voltages of one shot 24 and inverter 66 turn off the source drain paths of transistors 62 and 64 to decouple the voltage at terminal 76 from the voltage at terminal 74. During this interval the regenerative feedback action of inverters 90 and 102 maintains the voltage at terminal 76 at the same value it had while window 54 was open. The high voltage at terminal 72 forward biases the gate of transistor 104 to turn on the source drain path of transistor 104 during this interval while window 54 is closed.

If, for example, the voltage at terminal 76 is high when transparency window 54 closes, the turned off source drain paths of transistors 62 and 64 of pass gate 23 decouple the voltage at terminal 74 from terminal 76. Inverter 90 changes the high voltage at terminal 76 to a low voltage which the inverter supplies to terminal 96. The low voltage at terminal 96 cuts off the source drain path of transistor 98, while turning on the source drain path of transistor 100. The turned on source drain path of transistor 100 couples the $+V_{DD}$ voltage at the source of transistor 100 to terminal 106, to maintain the voltage at terminal 76 at the high level.

The regenerative action of circuit 25 also maintains a low voltage that is at terminal 76 at the beginning of the period when transparency window 54 closes. Inverter 90 changes the low voltage at terminal 76 to a high voltage at terminal 96. The high voltage at terminal 96 cuts off the source drain path of transistor 100, while turning on the source drain path of transistor 98. Simultaneously, the high voltage at terminal 72 turns on the source drain path of transistor 104, whereby the series connected low impedance source drain paths of transistors 98 and 104 couple the ground voltage at the source of transistor 98 to terminal 106. Thereby, the voltage at terminal 76 is maintained at the low level.

Inverter 82 changes the high levels at terminal 76 to a low level so output terminal 89 of the latch is essentially at ground in response to a high level being at data input terminal 74 during transparency window 54; the regenerative action of the latch maintains the low voltage at terminal 89 during the period while transparency window 54 is closed. In response to a low data signal voltage being applied to terminal 74 while transparency window 54 is open, the latch causes inverter 82 to supply a positive voltage to output terminal 89 during the period immediately following closing of the transparency window until the next time transparency window 54 opens.

FIG. 4 is a circuit diagram of a preferred embodiment of one shot 24. One shot 24, as illustrated in FIG. 4, includes P-channel field effect transistors 110 and 112, having source drain paths connected in parallel between DC power supply terminal $+V_{DD}$ and terminal 114. The gates of field effect transistors 110 and 112 are driven by the CK clock wave output of clock source 32 and a complementary modified replica thereof which inverter 116 derives.

Inverter 116 includes the series connected source drain paths of complementary field effect transistors 118 and 120. The gates of transistors 118 and 120 are connected in parallel and driven by the CK clock wave clock source 30 derives. The source drain paths of transistors 118 and 120 are connected in series between the $+V_{DD}$ and ground DC power supply terminals of integrated circuit chip 10. Common terminal 122 for the drains of transistors 118 and 120 supplies a modified inverted CK clock wave replica to the gate of transistor 112. The modification of the inverted CK clock wave replica occurs during window 54 because of a delay imposed on the negative going ramp at output terminal 122 of inverter 116.

The negative going ramp at terminal 122 occurs in response to positive going ramp 38 of waveform 34. Prior to the negative going ramp at terminal 122, the voltage at terminal 122 is positive to forward bias the gate of transistor 128 to turn on the source drain path of transistor 128 and turn off the source drain path of transistor 112. The negative going ramp at terminal 122 does not immediately change the state of the source drain path of field effect transistor 128 from a low impedance turned on state to a high impedance turned off state or the state of transistor 112 from an off state to an on state. This is because the gate of field effect transistor 128 has a large capacitance, resulting from a wider gate region than any other field effect transistor in the one shot. The large gate capacitance of field effect transistor 128 provides a relatively long time constant resistance capacitance (RC) discharge path for the negative going ramp at terminal 122. Consequently, the source diameter path of field effect transistor 128 stays on and the source drain path of transistor 112 stays off until several picoseconds of high voltage portion 50 of CK waveform 34 have elapsed; essentially transistors 112 and 128 respectively stay off and on during the entire interval of window 54 regardless of the state of the bi-level signal enable source 30 derives. The gate voltage of field effect transistor 112 stays high long enough during window 54 to prevent turn on of the source drain path of field effect transistor 112 to decouple terminal 114 from $+V_{DD}$.

During window 54, the high output voltage of enable source 30 drives the gate of field effect transistor 126 to turn on the source drain path of transistor 126. Consequently, terminal 114 is shunted to ground by the series connected low impedance source drain paths of N-channel field effect transistors 124, 126 and 128. The CK clock wave of clock source 32 and the modified inverted replica thereof at terminal 122 respectively drive the gates of transistors 124 and 128 to turn on the source drain paths of these two transistors.

Inverter 130 changes the low voltage at terminal 114 to a high voltage at terminal 136 during window 54. Inverter 130 includes complementary field effect transistors 132 and 134, having source drain paths connected in series between the $+V_{DD}$ and ground terminals. The voltage at terminal 114 drives the gates of transistors 132 and 134 in parallel and the drains of transistors 132 and 134 have a common terminal 136 where one shot 24 derives its output.

After window 54 has ended, the voltage at terminal 114 changes from a low, virtually ground value to the $+V_{DD}$ power supply voltage because the voltage at terminal 122 decreases sufficiently to cut off the source drain path of field effect transistor 128 and turn on the source drain path of field effect transistor 112. Consequently the low impedance source drain path of field effect transistor 112 couples terminal 114 to +$V_{DD}$ and the high impedance source drain path of field effect transistor 128 decouples terminal 114 from ground.

A low output voltage of enable source 30 prevents window 54 from opening. The low enable voltage of source 30 turns off the source drain path of transistor 126 to maintain terminal 114 at essentially the +$V_{DD}$ voltage the source drain path of transistor 110 applied to terminal 114 in response to the low voltage portion 36 of CK applied to the gate of transistor 124. The high impedance source drain path of transistor 126 decouples terminal 114 from ground. Consequently there is no direct connection of terminal 114 to ground or +$V_{DD}$ and terminal 114 has a tendency to float. However, the voltage at terminal 114 remains close to +$V_{DD}$ because (1) of the charge previously built up between the gates and sources of field effect transistors 132 and 134 and (2) the pulse duration (about 120 ps in a preferred embodiment) is too short for the charge to leak off. The voltage on terminal 114 stays sufficiently high to forward bias the gate of field effect transistor 134 and to back bias the gate of field effect transistor 132 so inverter 130 supplies a low voltage to terminal 136 until the voltage at terminal 122 drops sufficiently to forward bias the gate of field effect transistor 112. Forward biasing the gate of field effect transistor 112 turns on the source drain path of field effect transistor 112 to apply the +$V_{DD}$ voltage at the chip power supply to terminal 114. Consequently, inverter 130 continues to apply a low voltage to terminal 136. Thus, the low voltage enable source 30 supplies to the gate of transistor 126 maintains waveform 42 at low level 48 and prevents derivation of the pulse defined by wave portions 40, 44 and 46.

According to another aspect of the invention, achieved by the circuits illustrated in FIGS. 5 and 6, one shot logic circuit 28 derives PCK pulsed clock waveform 42 when the AND and OR logic functions of two data signals (enable 1 and enable 2) are respectively satisfied approximately at the time window 54 is open. In FIG. 5, the shunt path between terminal 114 and ground includes the source drain path of N-channel field effect transistor 140, having a source drain path connected in series with the source drain paths of transistors 124, 126 and 128. Field effect transistor 140 includes a gate electrode driven by a second enable source (en$_2$) 26 that can be internal to or external of integrated circuit chip 10.

The clock pulse circuit of FIG. 5 can derive waveform 42 only when enable sources en$_1$ and en$_2$ that respectively drive the gates of transistors 126 and 140 are high simultaneously. Thereby, the AND logic function is achieved with the circuit of FIG. 5 during the interval while window 54 is open, as controlled by the gate capacitance of field effect transistor 128 delaying negative going transition of the inverted clock at terminal 122.

The OR function is obtained by the circuit of FIG. 6 by connecting the source drain path of N-channel field effect transistor 142 in parallel with the source drain path of N-channel transistor 126. The gate of transistor 142 is responsive to enable data source (en$_2$) 26 from a circuit on integrated circuit chip 10 or external to the chip. A high value of enable data source (en$_1$) 30 and/or enable data source (en$_2$) 26 establishes a path through the source drain path of one or both of transistors 126 or 142 between terminal 114 and ground. Hence the circuit of FIG. 6 derives window 54 in waveform 42 in response to at least one of enable voltages en$_1$ or en$_2$ having a high value during the period when window 54 can occur. As discussed supra, window 54 can occur during high voltage portion 44 and about the first two-thirds of the period of ramp 46 while the gate capacitance of field effect transistor 128 establishes a delayed positive going transition of the inverted clock wave at terminal 122.

While there have been described and illustrated specific embodiments of the invention, it will be clear that variations in the details of the embodiments specifically illustrated and described may be made without departing from the true spirit and scope of the invention as defined in the appended claims.

What is claimed:

1. An integrated circuit adapted to be responsive to at least one data signal, plural bi-level signals and a clock source for deriving a clock wave having approximately a 50% duty cycle comprising first and second one shots, each having a first input terminal connected to be responsive to the clock wave and at least one second input terminal, each of the at least one second input terminals being connected to be responsive to one of the bi-level signals so that the at least one second input terminal of the first and second one shots are connected to be responsive to different ones of the bi-level signals; each one shot being arranged for deriving pulses in response to cycles of the clock while the bi-level signals applied to its at least one second input terminal has a predetermined value during a portion of a cycle of the clock wave, each of the pulses having a duration substantially less than one-half cycle of the clock wave and being initiated in response to and during a transition of the clock wave and persisting for a period after the transition has been completed; and a first latch connected to be responsive to one of the data signals and the pulses derived from the first one shot, a second latch connected to be responsive to one of the data signals and the pulses derived from the second one shot, each latch being arranged so that the latch is activated to be responsive to its respective data signal only during the pulses.

2. The integrated circuit of claim 1, wherein each of the latches includes a pass through gate responsive to the data signal and the pulses, so that the pass through gate passes the data signal only during the pulses.

3. The integrated circuit of claim 2, wherein each of the latches includes regenerative feedback circuitry connected to be responsive to the data signal as passed through the pass through gate, the feedback circuitry and the pass through gate being coupled with each other so that the feedback circuitry can change state in response to the data signal as passed through the pass through gate having a value different from a signal derived by the feedback circuitry.

4. The integrated circuit of claim 1, wherein each of the latches includes an input terminal for connection to a source of the data signal and an output terminal, a pass through gate having a path connected in series between the input and output terminals, the pass through gate being coupled with the one shot so that the pass through gate is opened only while the one shot is deriving the pulses.

5. The integrated circuit of claim 4, wherein each of the latches includes an amplifier stage connected between the input and output terminals to be responsive to the data signal passed by the pass through gate.

6. The integrated circuit of claim 5, wherein each of the latches includes regenerative feedback circuitry connected to be responsive to the data pulses passed by the pass through gate.

7. The integrated circuit of claim 5, wherein the feedback circuitry is responsive to the pulses so that the feedback circuitry can change state.

8. The integrated circuit of claim 7, wherein the feedback circuitry is connected to supply a signal resulting from latching of the passed data signal to the amplifier stage.

9. The integrated circuit of claim 4, wherein the latch includes regenerative feedback circuitry connected to be responsive to data pulses passed by the pass through gate.

10. The integrated circuit of claim 9, wherein the feedback circuitry is responsive to the pulses so that the feedback circuitry can change state.

11. The circuit of claim 1 further including a third latch as recited in claim 1, the third latch being connected to be responsive to one of the data signals and to be driven in parallel by the pulses derived by the first one shot.

12. The circuit of claim 11 wherein the first and third latches and the pulses the first one shot derives are arranged so that the first and third latches are connected to respond to the pulses of the first one shot having the same leading edge transition direction.

13. An integrated circuit adapted to be responsive to a data signal and a clock source for deriving a clock wave having approximately a 50% duty cycle comprising a one shot having an input terminal connected to be responsive to the clock wave; the one shot being arranged for deriving pulses in response to cycles of the clock, each of the pulses having a duration substantially less than one-half cycle of the clock wave and being initiated in response to and during a transition of the clock wave and persisting for a period after the transition has been completed; and a latch connected to be responsive to the data signal and the pulses, the latch being arranged so that the latch is activated to be responsive to the data signal only during the pulses, the one shot including Boolean logic circuitry responsive to the clock wave and at least one logic signal of at least one logic signal source for causing the one shot to derive the pulses in response to a predetermined relation of the at least one logic signal during a certain portion of the clock wave.

14. The integrated circuit of claim 13, wherein the logic circuitry responds to plural bi-level logic signals of plural logic signal sources to derive the pulses in response to all the plural logic signals having the same bi-level value.

15. The integrated circuit of claim 13, wherein the logic circuitry responds to plural logic signals of plural logic signal sources to derive the pulses in response to at least one of the plural logic signals having a predetermined bi-level value.

16. The integrated circuit of claim 13, further including a plurality of latches as recited in claim 11, the plural latches being connected to be driven in parallel by the pulses derived by the one shot.

17. The integrated circuit of claim 16, wherein the plural latches are cascaded with each other and a delay element connected between an output terminal of a first latch of the latches and an input terminal of a second of the latches.

18. An integrated circuit adapted to be responsive to a data signal and a clock source for deriving a clock wave having approximately a 50% duty cycle comprising a one shot having an input terminal connected to be responsive to the clock wave; the one shot being arranged for deriving pulses in response to cycles of the clock, each of the pulses having a duration substantially less than one-half cycle of the clock wave and being initiated in response to and during a transition of the clock wave and persisting for a period after the transition has been completed; and a latch connected to be responsive to the data signal and the pulses, the latch being arranged so that the latch is activated to be responsive to the data signal only during the pulses, the one shot including a clock input terminal connected to be responsive to the clock wave, an inverter connected to be responsive to the clock wave at the clock input terminal of the one shot, the inverter having an output terminal, first and second field effect transistors of like conductivity type having source drain paths and gate electrodes connected to be respectively responsive to the clock wave and the voltage at the inverter output terminal, the source drain paths of the field effect transistors being turned on in response to like polarity gate source voltages thereof exceeding a predetermined value, and a circuit including series connected source drain paths of the first and second field effect transistors connected in series with each other in a branch between a power supply terminal of the integrated circuit and a signal terminal, the branch being selectively arranged to provide (a) a low impedance between the power supply terminal and signal terminal when the first and second field effect transistors source drain paths are turned on and (b) a high impedance between the power supply terminal and signal terminal when the source drain path of one of the field effect transistors is turned off, at least one of the field effect transistors having a gate capacitance causing the pulses to persist after the transition has been completed to derive at the signal terminal a pulse having (a) a duration substantially less than a half cycle of the clock wave and (b) a leading edge that starts in response to and during the transition of the clock wave forward biasing the gate source region of one of the transistors, the pulse having a trailing edge that starts in response to the voltage of the gate source region of the other transistor cutting off the source drain path of the other transistor, the gate capacitance causing the voltage of the gate source region of the other transistor to reach a value causing cutting off the source drain path of the other transistor after the transition has been completed and before a half cycle of the clock wave has been completed.

19. The integrated circuit of claim 18, wherein the branch includes the source drain path of at least one further field effect transistor, each further field effect transistor being responsive to a logic signal, each further transistor and the first and second field effect transistors being interconnected to form a Boolean logic circuit.

20. The integrated circuit of claim 19, wherein plural further transistors are included in the logic circuit, each of the plural further transistors having a source drain path connected in series with the first and second transistors.

21. The integrated circuit of claim 19, wherein plural further transistors are included in the logic circuit, the plural further transistors having parallel connected source drain paths connected in series with the first and second transistors.

22. The integrated circuit of claim 18, wherein the signal terminal is connected to another power supply terminal of the integrated circuit through an impedance.

23. The integrated circuit of claim 22, wherein the impedance is connected to be responsive to the voltage at the inverter output terminal so that the impedance decouples the another power supply terminal from the signal terminal.

24. The integrated circuit of claim 23, further including another inverter having an input terminal connected to be responsive to the voltage at the signal terminal.

25. A source of clock pulses responsive to a clock wave having approximately a 50% duty cycle comprising a one shot including an inverter connected to be responsive to the clock wave at a clock input terminal of the one shot, the inverter having an output terminal, first and second field effect transistors of like conductivity type having source drain paths and gate electrodes connected to be respectively responsive to the clock wave and the voltage at the inverter output terminal, the source drain paths of the field effect transistors being turned on in response to like polarity gate source voltages thereof exceeding a predetermined value, and a circuit including series connected source drain paths of the first and second field effect transistors connected in series with each other in a branch between a power supply terminal of the integrated circuit and a signal terminal, the branch being selectively arranged to provide (a) a low impedance between the power supply terminal and signal terminal when the first and second field effect transistors source drain paths are turned on and (b) a high impedance between the power supply terminal and signal terminal when the source drain path of one of the field effect transistors is turned off, at least one of the field effect transistors having a gate capacitance causing the clock pulses to persist at the signal terminal after a transition of the clock wave has been completed to derive at the signal terminal a pulse having (a) a duration substantially less than a half cycle of the clock wave, and (b) a leading edge that starts in response to and during the transition of the clock wave forward biasing the gate source region of one of the transistors, the pulse having a trailing edge that starts in response to the voltage of the gate source region of the other transistor cutting off the source drain path of the other transistor, the gate capacitance causing the voltage of the gate source region of the other transistor to reach a value causing cutting off the source drain path of the other transistor after the transition has been completed and before a half cycle of the clock wave has been completed.

26. The source of claim 25, wherein the branch includes the source drain path of at least one further field effect transistor, each further field effect transistor being responsive to a logic signal, each further field effect transistor and the first and second field effect transistors being interconnected in the branch to form a Boolean logic circuit.

27. The source of claim 26, wherein plural further field effect transistors are included in the logic circuit, the plural further field effect transistors having source drain paths connected in series with the source drain paths of first and second field effect transistors.

28. The source of claim 27, wherein plural further field effect transistors are included in the logic circuit, the plural further field effect transistors having parallel connected source drain paths connected in series with the first and second field effect transistors.

29. The source of claim 25 further including third and fourth field effect transistors of a conductivity type opposite from the conductivity type of the first and second field effect transistors, the third and fourth field effect transistors having (a) source drain paths in parallel with each other between another power supply terminal of the integrated circuit and the signal terminal, and (b) gate electrodes respectively connected to be responsive to the voltage at the inverter output terminal and the clock wave at the clock input terminal of the one-shot.

30. The source of claim 29 further including another inverter having an input terminal connected to be responsive to voltage at the signal terminal.

31. An integrated circuit adapted to be responsive to at least one data signal and a clock source for deriving a clock wave having approximately a 50% duty cycle comprising a one shot having an input terminal connected to be responsive to the clock wave; the one shot being arranged for deriving pulses in response to cycles of the clock, each of the pulses having a duration substantially less than one-half cycle of the clock wave and being initiated in response to and during a transition of the clock wave and persisting for a period after the transition has been completed; and a first latch connected to be responsive to one of the data signals and the pulses, a second latch connected to be responsive to one of the data signals and the pulses, the first and second latches being arranged so that the latches are activated to be responsive to their respective data signals only during the pulses, the first and second latches and the pulses the one shot derives being arranged so that the first and second latches are connected to be activated in response to the pulses of the one shot having the same leading edge transition direction.

32. The circuit of claim 31 wherein the at least one data signal and the clock wave are synchronized.

\* \* \* \* \*